US007549872B2

(12) United States Patent
Akahori et al.

(10) Patent No.: US 7,549,872 B2
(45) Date of Patent: Jun. 23, 2009

(54) ELECTRIC JUNCTION BOX

(75) Inventors: Masahiro Akahori, Shizuoka (JP); Takao Nogaki, Shizuoka (JP); Toshinori Iwai, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 12/068,705

(22) Filed: Feb. 11, 2008

(65) Prior Publication Data

US 2008/0200045 A1 Aug. 21, 2008

(30) Foreign Application Priority Data

Feb. 15, 2007 (JP) ............................. 2007-034592

(51) Int. Cl.
*H01R 12/00* (2006.01)
*H05K 1/00* (2006.01)

(52) U.S. Cl. .................. 439/76.2; 439/620.27; 439/949

(58) Field of Classification Search ................. 439/949, 439/620.27, 76.2
See application file for complete search history.

(56) References Cited

U.S. PATENT DOCUMENTS 6,077,102 A * 6/2000 Borzi et al. ................. 439/364
6,322,376 B1 * 11/2001 Jetton ......................... 439/76.2
6,561,822 B2 * 5/2003 Depp et al. ................ 439/76.2
6,679,708 B1 * 1/2004 Depp et al. ................ 439/76.2
2003/0219998 A1 * 11/2003 Kakuta et al. .............. 439/76.2

FOREIGN PATENT DOCUMENTS

JP H10-241547 9/1998
JP 2001-155618 6/2001

* cited by examiner

*Primary Examiner*—Hae Moon Hyeon
*Assistant Examiner*—Harshad C Patel
(74) *Attorney, Agent, or Firm*—Edwards Angell Palmer & Dodge LLP

(57) ABSTRACT

An electric junction box, which can be easily assembled even if the electric junction box includes an electric power distributing unit, is provided. The electric junction box includes: a box body; a busbar attached to the box body, electric power from a power supply being supplied to the busbar; an electric power distributing unit attached to the box body, the electric power being supplied to the electric power distributing unit through the busbar; and a connector section connecting the busbar to an electric power inputting section of the electric power distributing unit, the box body being provided with the connector section.

2 Claims, 8 Drawing Sheets

ELECTRIC JUNCTION BOX

BACKGROUND OF THE INVENTION (1) Field of the Invention

The present invention relates to an electric junction box to be mounted on a motor vehicle as a mobile unit.

(2) Description of the Related Art

Generally, a motor vehicle as a mobile unit mounts various electronic equipment, for example, a lamp such as a headlamp or tail lamp, a motor such as a starter motor or motor for an air conditioner, and so on.

In order to supply electric power to the various electronic equipment described above, the motor vehicle is provided with a junction block at an appropriate position of the vehicle. The junction block is formed by putting various electrical circuit units such as many fuses or relays together.

Since the junction block may include a fuse, relay or busbar, therefore the junction block may be called a fuse block, relay box or electric junction box as a generic term (for example, see Japanese Patent Application Laid-Open No. H10-241547 and Japanese Patent Application Laid-Open No. 2001-155618). Hereinafter, in this specification, a fuse block, relay box and junction block are called electric junction box as a generic term.

An electric junction box shown in Japanese Patent Application Laid-Open No. H10-241547 and Japanese Patent Application Laid-Open No. 2001-155618 includes a box body forming an external form of the electric junction box and a wiring block. The box body is made of electrically insulating synthetic resin and formed in a box-shape. The box body includes: a mounting section, on which electrical components such as a relay and fuse, and a power integration as an electric power distributing unit are mounted; and a connector fitting section, to which a connector of a wiring harness is fitted.

The wiring block is received in the box body. The wiring block includes: a first busbar to be connected to a battery as a first power source; a second busbar to be connected to an electric generator as a second power source; a fuse connecting the first busbar to the second busbar; and a connecting terminal.

Each of the first and second busbars is made of an electrically conductive sheet metal and includes: a power source connecting section to be connected to the battery or generator described above; and a terminal section, which is positioned within the mounting section when the wiring block is received in the box body, and is connected to the electrical components such as a relay or fuse and the power integration. A plurality of the terminal sections, each of which is connected to the electrical components such as a relay or fuse, are provided, while one terminal section, which is connected to the power integration, is provided.

The fuse connects a part of the first busbar to a part of the second busbar, each said part being located away from the power source connecting section. One part of the connecting terminal is positioned within the mounting section and connected to the electrical components such as a relay or fuse, while another part of the connecting terminal is positioned within the connector fitting section and connected to the connector of the wiring harness.

The power integration includes: a frame body made of electrically insulating synthetic resin and formed in a box-shape; a plurality of fuses attached to the frame body; a plurality of relays received within the frame body; and a busbar which electrically connects the fuses to the relays according to a predetermined pattern.

The busbar of the power integration includes: an electric power inputting section, which is connected to the terminal section of the first or second busbar through an electric wire and to which the electric power is supplied from the power source through the first or second busbar; and a plurality of electric power outputting sections. The busbar of the power integration allows the electric power inputted to the electric power inputting section to diverge to a plurality of the electric power outputting sections through a fuse and relay. The electric power outputting section of the busbar of the power integration is connected to various electronic instruments through a wiring harness.

In the electric junction box described above, the wiring block electrically connects the power source, electrical components, power integration, and electric wires of the wiring harness according to a predetermined pattern. The electric junction box supplies desired electric power to the respective electronic instruments through the wiring harness.

In the electric junction box described above, the electric power inputting section of the busbar of the power integration is connected to the terminal section of the wiring block through an electric wire. Such an electric wire tends to be thick because the electric power flowing therein is large.

Moreover, since various electronic instruments are mounted on the motor vehicle, the electric wires constituting the wiring harness tends to increase. Accordingly, demanded is an electric junction box which is capable of mounting various electronic instruments with high density mounting. Of course, a distance between the electric power inputting section of the busbar of the power integration and the terminal section of the wiring block tends to be small. As a result, in order to connect the electric power inputting section of the busbar of the power integration to the terminal section of the wiring block by using a relatively thick electric wire, so far, assembly of the electric junction box tends to be difficult because it is necessary to bend the thick electric wire within a narrow space.

SUMMARY OF THE INVENTION

It is therefore an objective of the present invention to solve the above problem and to provide an electric junction box, which can be easily assembled even if the electric junction box includes the electric power distributing unit.

In order to attain the above objective, the present invention is an electric junction box including:

- a box body;
- a busbar attached to the box body, electric power from a power supply being supplied to the busbar;
- an electric power distributing unit attached to the box body, the electric power being supplied to the electric power distributing unit through the busbar; and
- a connector section connecting the busbar to an electric power inputting section of the electric power distributing unit, the box body being provided with the connector section.

With the construction described above, since the box body is provided with the connector section which connects the busbar, to which the electric power from the power supply is supplied, to the electric power inputting section of the electric power distributing unit, therefore there is no necessity to connect the busbar to the electric power distributing unit through an electric wire. As a result, such an electric wire for connecting the busbar to the electric power distributing unit is not needed and therefore, a connecting structure and manhour associated with the connection using such an electric wire are not needed. Accordingly, there is no necessity to bend an electric wire within a narrow space, so that the electric junction box can be easily assembled. That is, the electric junction box can be easily assembled even if the electric junction box includes the electric power distributing unit.

The connector section includes: a terminal fitting connected to both of the busbar and the electric power inputting section of the electric power distributing unit; and a housing receiving the terminal fitting.

With the construction described above, since the connector section can securely directly connect the busbar to the electric power distributing unit, therefore, there is no necessity to bend an electric wire within a narrow space and therefore, the electric junction box can be easily assembled even if the electric junction box includes the electric power distributing unit.

DESCRIPTION OF THE PREFERRED EMBODIMENTS

In the following, a preferred embodiment of the present invention will be explained with reference to FIGS. 1-8. An electric junction box 1 according to a preferred embodiment of the present invention, which is shown in FIG. 1, is mounted on a motor vehicle as a mobile unit.

Figure 1:
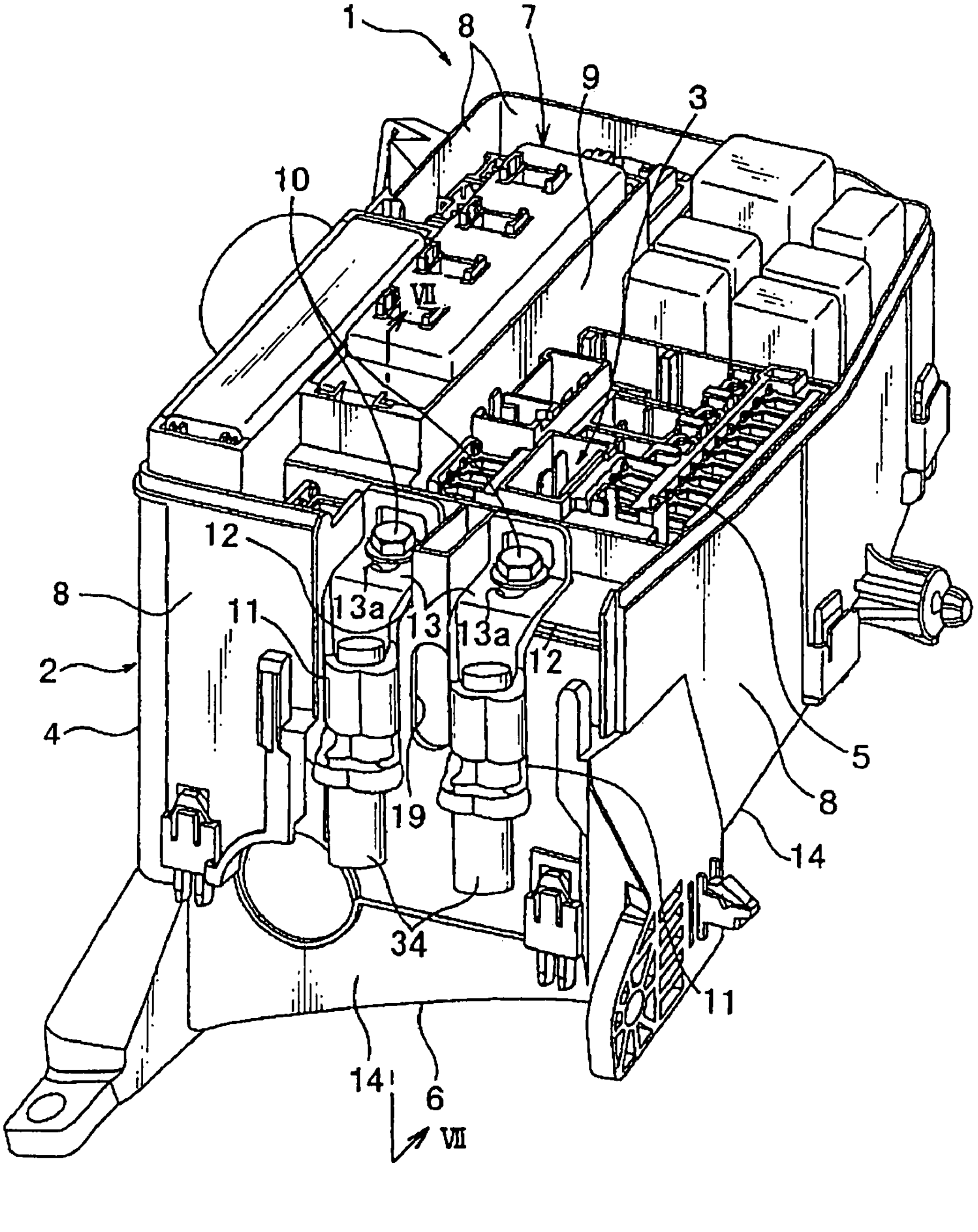
FIG. 1 is a perspective view of an electric junction box according to a preferred embodiment of the present invention.

As shown in FIG. 1, the electric junction box 1 includes a box body 2, wiring block 3, power integration (hereinafter, integration) 7 as an electric power distributing unit, and connector section 20 (shown in FIG. 2).

As shown in FIG. 1, the box body 2 includes a body part 4, cassette block 5, upper cover (not shown in the figure), and lower cover 6. The body part 4 is made of electrically insulating synthetic resin and molded by means of known injection molding. As shown in FIG. 2, the body part 4 is formed in a tube-shape with a plurality of outer walls 8 which continue to each other. The body part 4 is provided with a partition wall 9 which partitions the body part 4.

Figure 2:
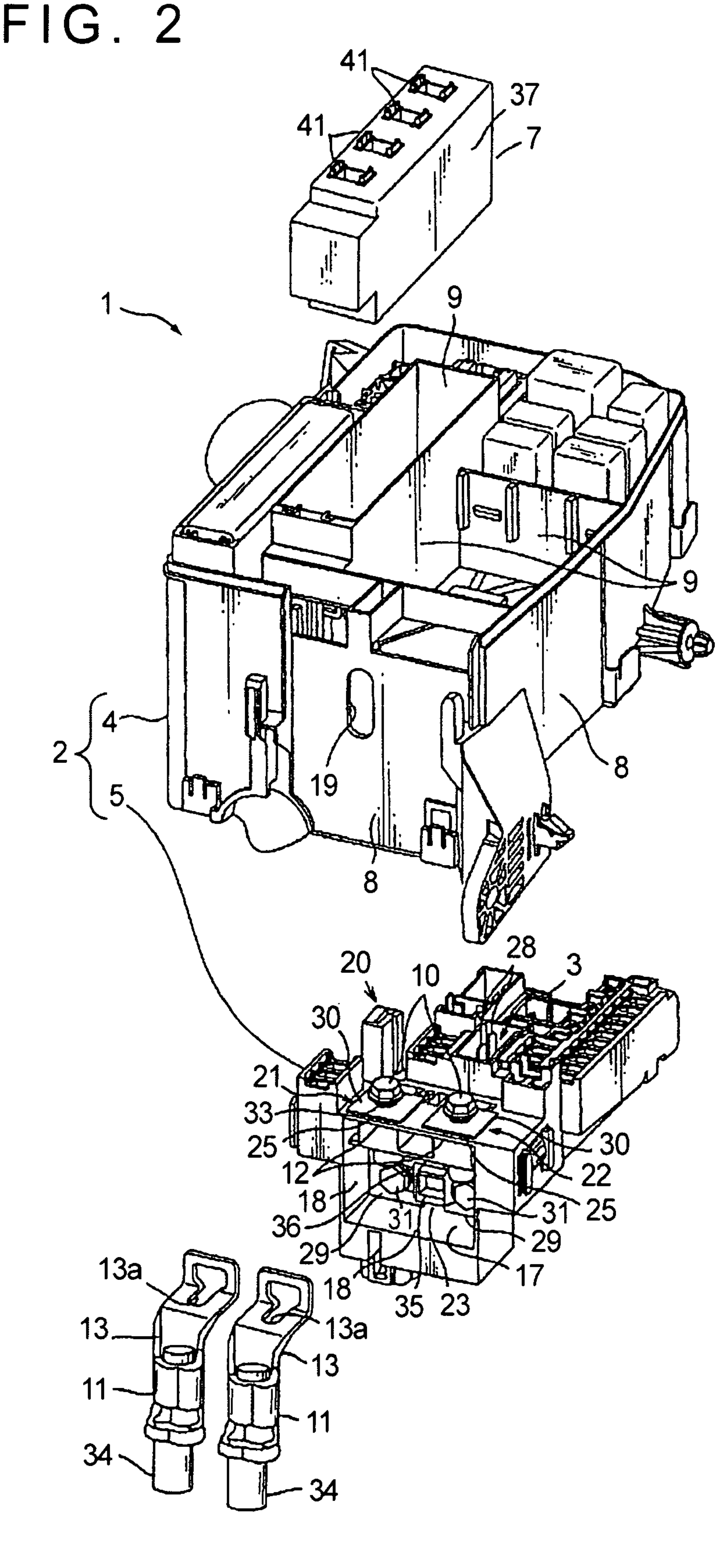
FIG. 2 is an exploded perspective view of the electric junction box shown in FIG. 1.

An upper surface of the body part 4 shown in FIG. 2 is provided with a mounting section, on which electrical components such as a relay and fuse are mounted, while a lower surface of the body part 4 shown in FIG. 2 is provided with a connector fitting section, to which a connector of a wiring harness (not shown in the figure) is fitted.

The body part 4 receives a busbar which electrically connects the electrical components mounted on the mounting section to a terminal of the connector of the wiring harness fitted to the connector fitting section according to a predetermined pattern.

The cassette block 5 is made of electrically insulating synthetic resin and formed in a box-shape having a size capable of being received in the body part 4, as shown in FIG. 2. The cassette block 5 is received in the body part 4 passing through a lower opening of the body part 4 shown in FIG. 2. The cassette block 5 is provided with a slit-shaped busbar-receiving groove which receives busbars 21, 22 (explained later) of the wiring block 3.

Figure 3:
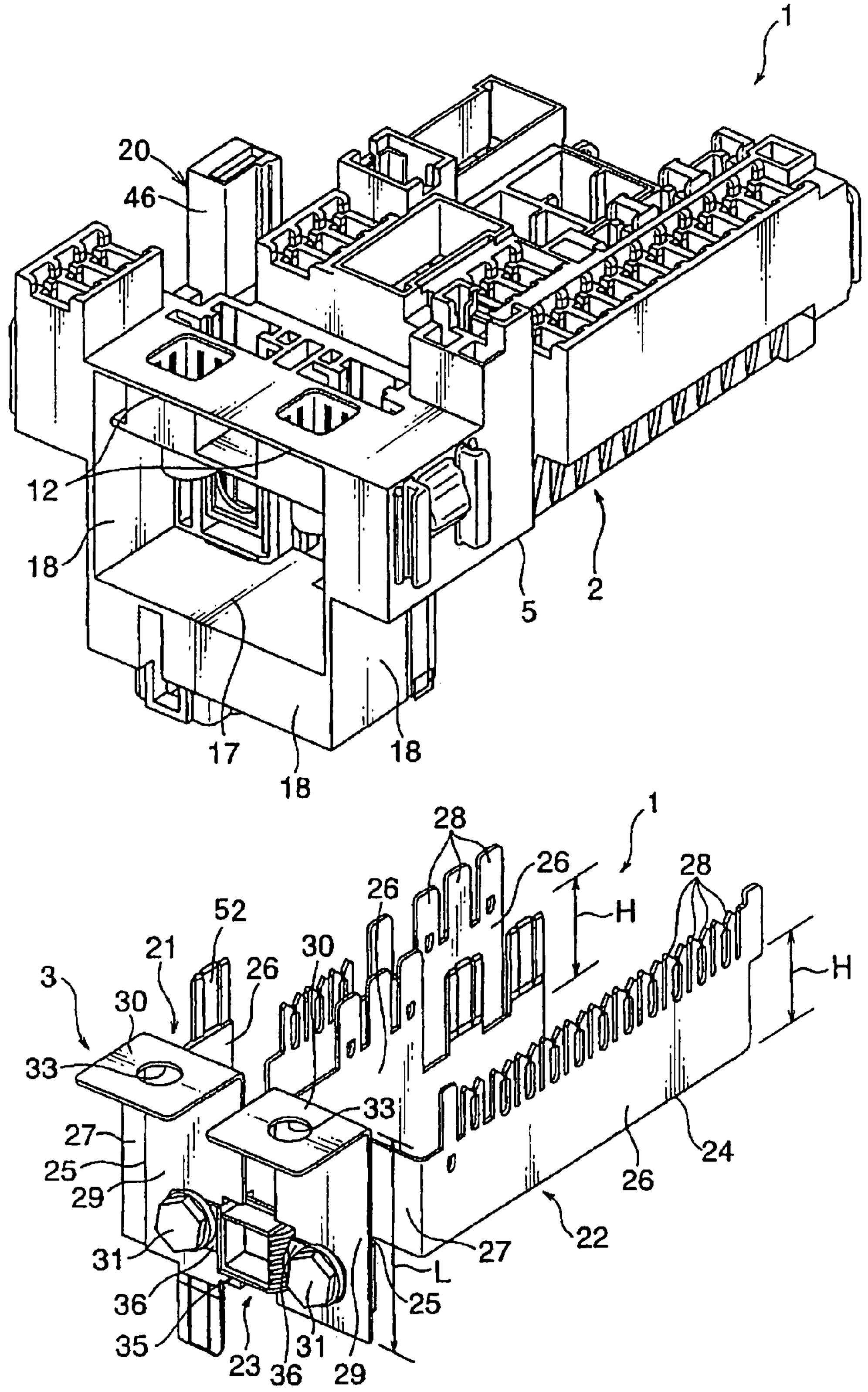
FIG. 3 is a perspective view illustrating a cassette block and wiring block and so on of the electric junction box shown in FIG. 1.

An upper surface of the cassette block 5 shown in FIGS. 2 and 3 is provided with a mounting section, on which electrical components such as a relay and fuse are mounted, while a lower surface of the cassette block 5 shown in FIGS. 2 and 3 is provided with a fitting section, on which a connector and terminal fitting of the wiring harness is fitted.

The wiring harness includes a plurality of electric wires and connectors attached to ends of the electric wires. The connector fits to the connector fitting section described above, the fitting section described above, a connector fitting section 42 (explained later), and various electronic instruments mounted on a motor vehicle.

The upper surface of the cassette block 5 is provided with two terminal attaching sections 12. The terminal attaching section 12 is positioned at an end of the busbar-receiving groove. A surface of the terminal attaching section 12 is formed flat. A nut (not shown in the figure) is embedded in the terminal attaching section 12.

A connecting piece 30 (explained later) of the busbar 21, 22 and an electric contacting section 13 of the terminal fitting 11 (shown in FIG. 4) connected to a power supply are placed in turn on a surface of the terminal attaching section 12, and a through hole 33 of the connecting piece 30 and a bolt 10 passed through a hole 13*a* of the electric contacting section 13 are screwed into the nut described above, so that the electric contacting section 13 of the terminal fitting 11 is clamped between the connecting piece 30 and a head of the bolt 10, whereby the terminal attaching section 12 attaches a terminal fitting 11 (shown in FIG. 4).

The upper cover is made of electrically insulating synthetic resin and molded by means of known injection molding. The upper cover is formed in a tube-shape having a bottom with a plurality of outer walls which continue to each other. The upper cover is attached to the body part 4 in such a manner that the upper cover covers an upper surface of the body part 4.

The lower cover 6 is made of electrically insulating synthetic resin and molded by means of known injection molding. As shown in FIG. 1, the lower cover 6 is formed in a tube-shape having a bottom with a plurality of outer walls 14 which continue to each other. The lower cover 6 is attached to the body part 4 in such a manner that the lower cover 6 covers a lower surface of the body part 4.

The box body 2 is provided with a fuse-receiving chamber 17 shown in FIGS. 2 and 3. The fuse-receiving chamber 17 is a space, which is formed in the box body 2 and receives fuse 23 (explained later) of the wiring block 3 attached to the cassette block 5. The fuse-receiving chamber 17 is formed being surrounded by a plurality of walls 18 (shown in FIGS. 2 and 3) positioned in the proximity of the terminal-attaching section 12 of the cassette block 5 and the outer wall 8 of the body part 4. As shown in FIG. 2, a peep hole 19 passes through the outer wall 8 of the body part 4.

The peep hole 19 is a long hole extending straight along the longitudinal direction of the bolt 10 and enables to see the fuse 23 received in the fuse-receiving chamber 17 from the outside of the body part 4, i.e. from the outside of the box body 2. Further, the peep hole 19 enables to see the fuse 23 from the outside of the body part 4, i.e. from the outside of the box body 2 from above in FIG. 2.

The electrical components such as the relay or fuse are mounted on the body part 4 and on the cassette block 5 mounted on the body part 4, the connectors of the wiring harness are fitted to the body part 4 and to the cassette block 5, the terminal fittings 11 are attached to the terminal attaching sections 12, and the upper cover and the lower cover 6 are attached to the body part 4, whereby the box body 2 receives the electrical components such as the relay or fuse and the terminal fittings 11.

Figure 4:
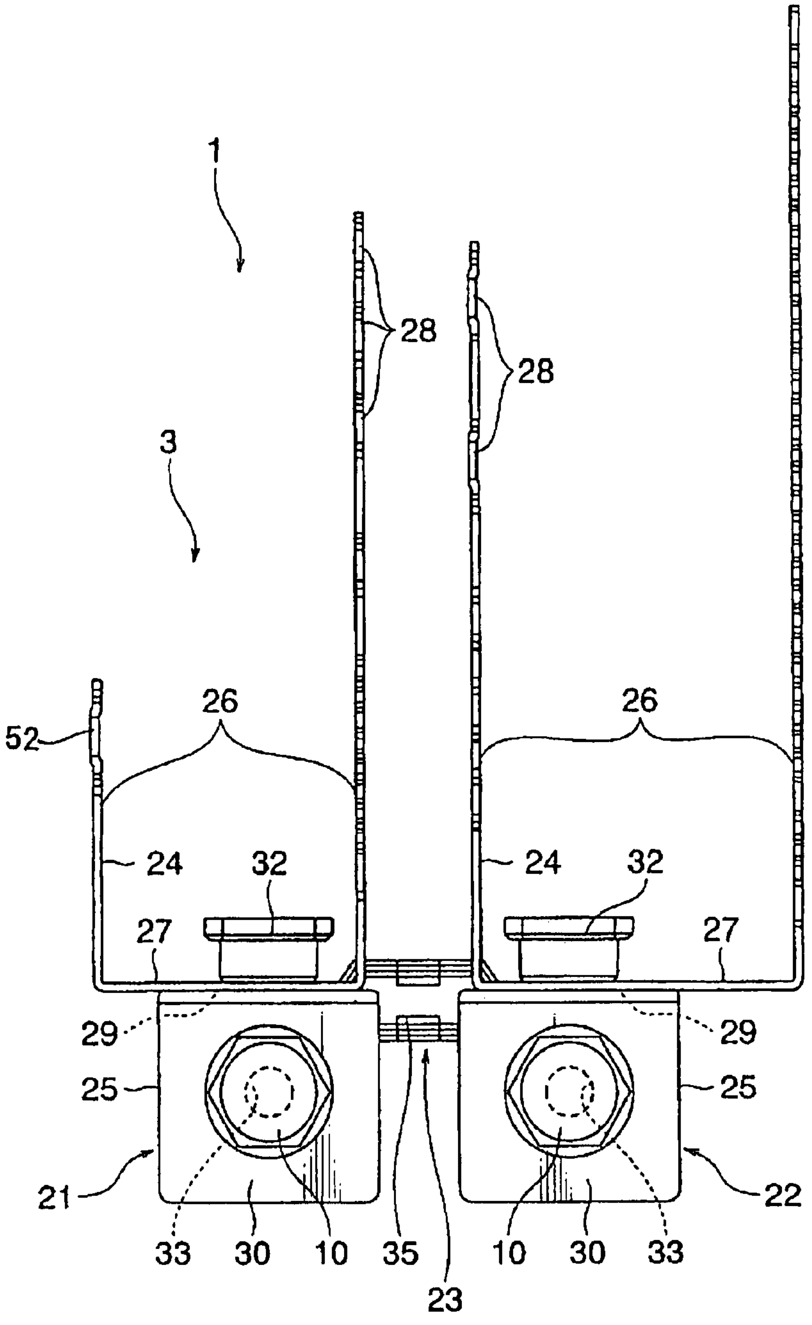
FIG. 4 is a plan view illustrating the wiring block shown in FIG. 3.

As shown in FIGS. 3 and 4, the wiring block 3 includes the first busbar 21, the second busbar 22, the fuse 23 connecting the busbars 21 and 22 to each other, and a connecting terminal (not shown in the figure).

Each of the first busbar 21 and the second busbar 22 is formed with an electrically conductive sheet metal. The busbars 21 and 22 have approximately the same structure.

As shown in FIGS. 3 and 4, each of the busbars 21 and 22 includes an electrical component connecting section 24 and power supply connecting section 25. The electrical component connecting section 24 includes a pair of parallel parts 26 parallel to each other and a connecting part 27 connecting ends of the parallel parts 26. The electrical component connecting section 24 is formed in a U-shape in its plan view. The parallel part 26 is provided with a plurality of terminal parts 28, which are positioned within the mounting section of the cassette block 5 and connected to the relay or fuse described above. A width H of the electrical component connecting section 24 is formed constant throughout the entire length thereof.

The power supply connecting section 25 integrally includes a fuse connecting piece 29 as a fuse connecting section and a connecting piece 30 as a connecting section. The fuse connecting piece 29 is formed in a band plate-shape, and placed onto and attached to the connecting part 27 of the electrical component connecting section 24. The fuse connecting piece 29 is integrally provided with a nut 32, into which a bolt 31 for fastening the fuse is screwed.

The connecting piece 30 rises up from an edge positioned above the fuse connecting piece 29 in FIG. 3. Therefore, the fuse connecting piece 29 is arranged at a position where the fuse connecting piece 29 is placed on the connecting piece 30 along the longitudinal direction of the bolt 10. That is, the fuse connecting piece 29 is arranged in the proximity of the connecting piece 30 as the connecting section. The connecting piece 30 is provided with a through hole 33 to permit the bolt 10 to pass therethrough.

A length L of the power supply connecting section 25 (i.e. a length of the fuse connecting piece 29) is formed larger than the width H of the electrical component connecting section 24. The terminal fitting 11, which is connected to an electric generator as the power supply through an electric wire 34, is attached to the connecting piece 30 of the power supply connecting section 25 of the first busbar 21. The terminal fitting 11, which is connected to a battery as the power supply through an electric wire 34, is attached to the connecting piece 30 of the power supply connecting section 25 of the second busbar 22. Thus, electric power from the power supply is supplied to the busbars 21, 22 through the respective terminal fittings 11.

The fuse 23 includes a body part 35 having a fusible element and a pair of terminal sections 36 extending in a direction leaving each other from the body part 35. The terminal section 36 is provided with a hole which allows a bolt 31 for connecting a fuse to pass therethrough. The pair of the terminal sections 36 is connected to the fusible element.

One terminal section 36 of the fuse 23 is placed on the fuse connecting piece 29 of the power supply connecting section 25 of the first busbar 21, while another terminal section 36 of the fuse 23 is placed on the fuse connecting piece 29 of the power supply connecting section 25 of the second busbar 22, and the bolt 31 passed through the hole is screwed into the nut 32, so that the fuse 23 connects the busbars 21 and 22 to each other and thus the fuse 23 is attached to the busbars 21 and 22. When a current flowing between the busbars 21 and 22 exceeds a predetermined current value, the fusible element fuses to cut off the current flowing between the busbars 21 and 22.

A part of the connecting terminal is positioned within the mounting section of the cassette block 5 and connected to the electrical components such as a relay or fuse, while another part of the connecting terminal is positioned within the fitting section of the cassette block 5 and connected to a terminal of a wiring harness.

As for the wiring block 3, mainly the electrical component connecting sections 24 of the busbars 21 and 22 are received in the busbar-receiving groove, the fuse connecting piece 29 of the power supply connecting section 25 and the fuse 23 are received in the fuse-receiving chamber 17, the connecting piece 30 of the power supply connecting section 25 is placed on the terminal attaching sections 12, so that the wiring block 3 is mounted to the cassette block 5. That is, the first busbar 21 and the second busbar 22 are received in the cassette block 5 of the box body 2. Then, the terminal fittings 11 are attached to the respective terminal attaching sections 12, so that the wiring block 3 is connected to the electric generator and the battery through the terminal fitting 11 and the electric wire 34.

Figure 5:
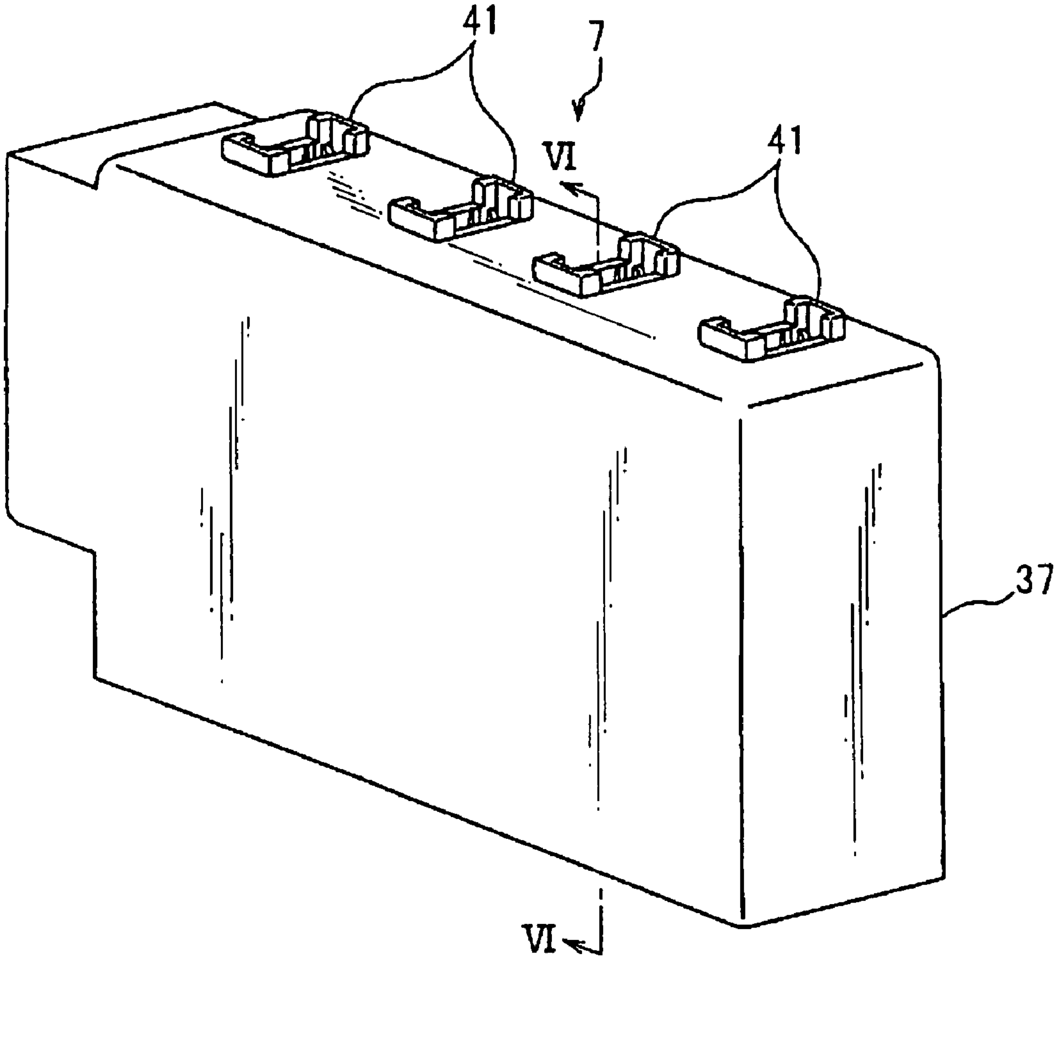
FIG. 5 is a perspective view illustrating integration of the electric junction box shown in FIG. 1.
Figure 6:
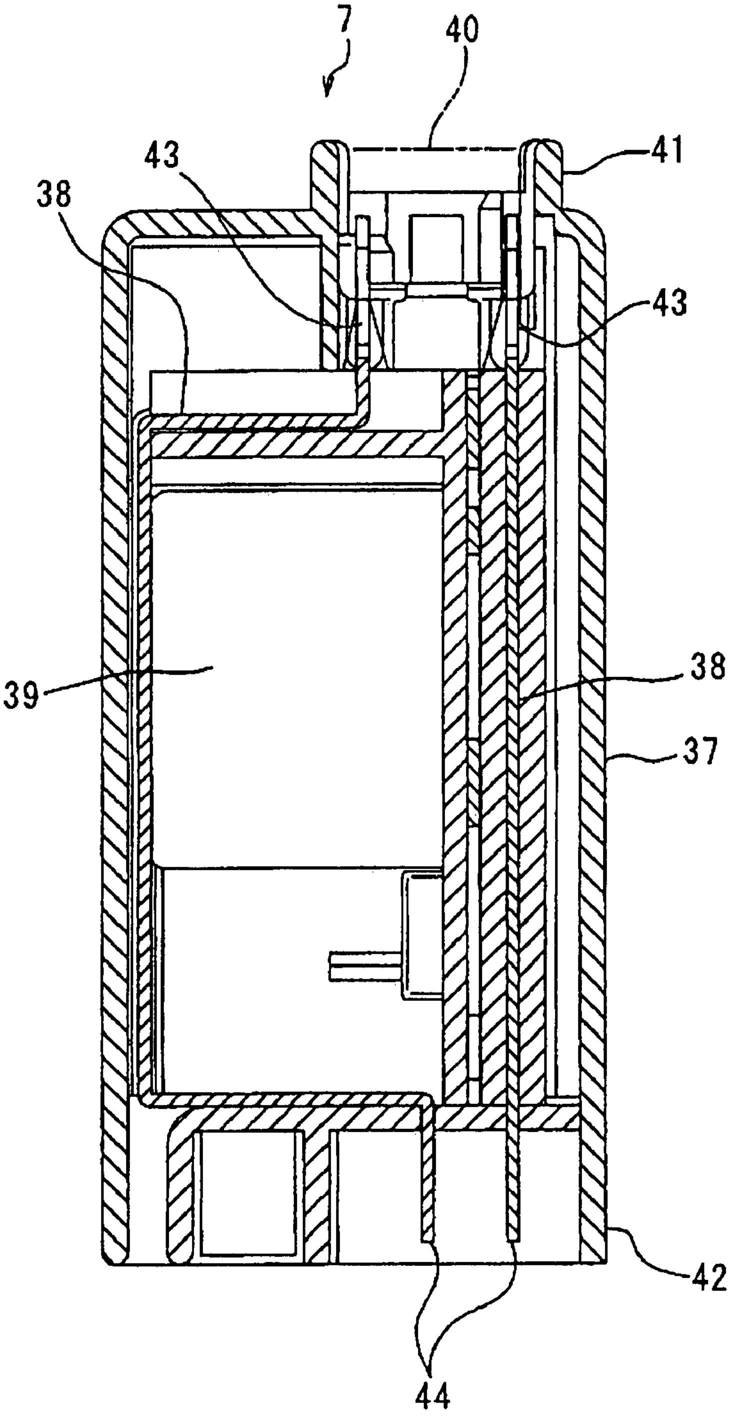
FIG. 6 is a cross sectional view taken along VI-VI line in FIG. 5.

As shown in FIGS. 5 and 6, the integration 7 includes a case 37, a pair of busbars 38 (shown in FIG. 6), a plurality of relays 39 (only one relay 39 being shown in FIG. 6), and a plurality of fuses 40 (only one fuse 40 being shown in FIG. 6).

The case 37 is made of electrically insulating synthetic resin and formed in a flat box-shape. An upper surface of the case 37 shown in FIG. 5 is provided with fuse attaching sections 41 to which fuses 40 are attached. A lower surface of the case 37 is provided with a connector fitting section 42 (shown in FIG. 6) to which the connector of the wiring harness is fitted. The case 37 or the integration 7 is positioned between the partition walls 9 of the body part 4 of the box body 2 and received in the body part 4.

The pair of the busbars 38 is made of electrically conductive sheet metal. Each busbar 38 includes: a fuse connecting terminal section 43, which is positioned within the fuse attaching sections 41 and connected to the fuse 40; and a connector connection terminal section 44, which is positioned within the connector fitting section 42 and connected to the connector of the wiring harness.

One busbar 38 integrally includes a connecting piece 45 (shown in FIG. 8) as the electric power inputting section which is connected to a terminal fitting 47 (explained later) of the connector section 20 when the integration 7 is received in the body part 4.

The relay 39 is attached to the one busbar 38. The fuse 40 is attached to the fuse attaching sections 41 so as to connect the fuse connecting terminal sections 43 of the pair of the busbars 38 to each other. Each fuse 40 corresponds to each relay 39.

When the integration 7 is received in the body part 4 of the box body 2, the connecting piece 45 of one busbar 38 is supplied with electric power from the power supply through the terminal fitting 47 of the connector section 20. Then, the one busbar 38 distributes the electric power and forward the electric power to the fuse 40 and the other busbar 38 in turn through the relay 39. Then, the integration 7 provides the distributed electric power forwarded to the relay 39 and the fuse 40 in turn to the electronic instruments through the connectors of the wiring harness fitted to the connector fitting section 42. Thus, the integration 7 distributes the electric power supplied from the power supply to the respective electronic instruments.

Figure 7:
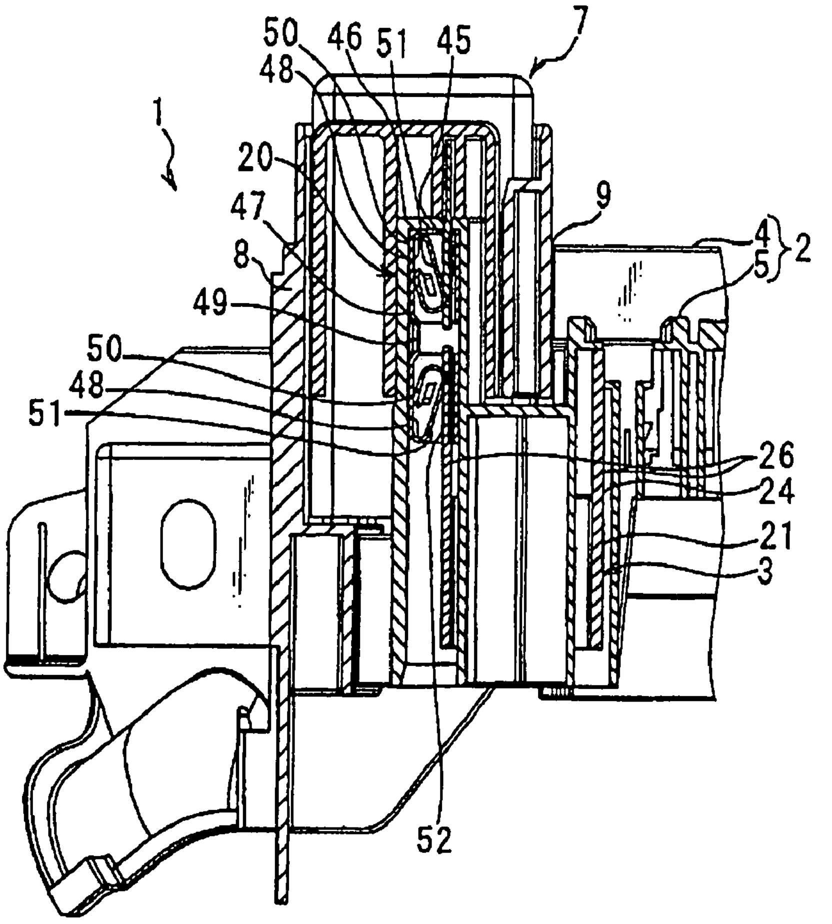
FIG. 7 is a cross sectional view taken along VII-VII line in FIG. 1.
Figure 8:
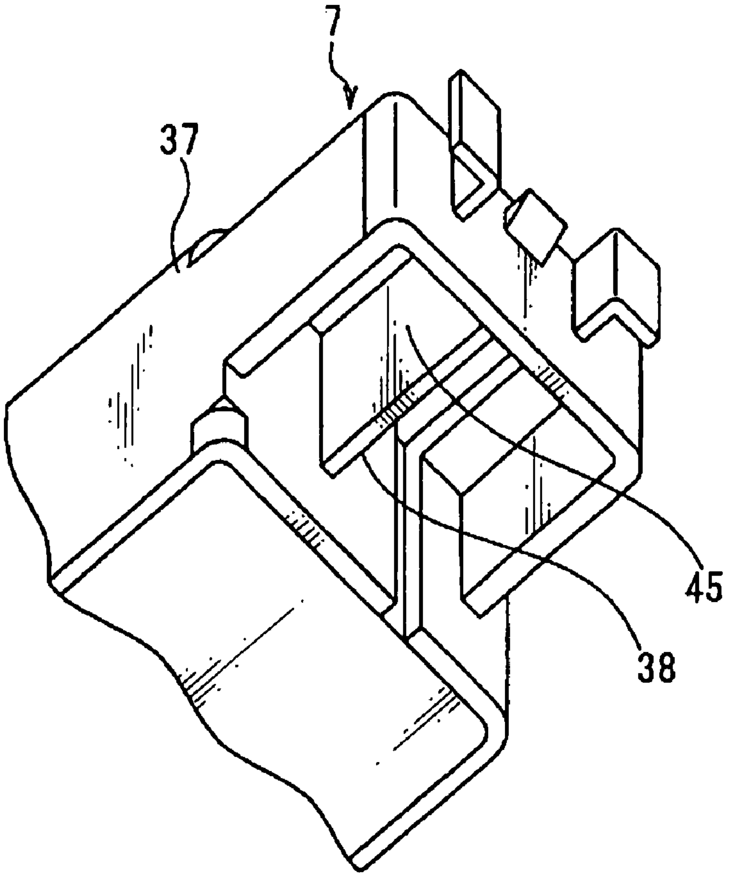
FIG. 8 is a perspective view from below illustrating a primary part of the integration shown in FIG. 5.

As shown in FIG. 7, the connector section 20 includes a housing 46 integrally provided on the cassette block 5 and terminal fitting 47. That is, the box body 2 is provided with the connector section 20. The housing 46 is made of electrically insulating synthetic resin similarly to the cassette block 5. The housing 46 is formed in a tube-shape. An axis of the housing 46 is parallel to a mounting direction (i.e. a direction approaching the body part 4 upon mounting) of the cassette block 5 and the integration 7 to the body part 4.

The terminal fitting 47 is formed by bending an electrically conductive sheet metal. The terminal fitting 47 integrally includes a pair of electric contacting sections 48 and a connecting piece 49 which connects the electric contacting sections 48 to each other. The electric contacting sections 48 includes a square tube-shaped body part 50 and a spring piece 51 arranged in the body part 50. The spring piece 51 presses a connecting piece 52 (shown in FIG. 3) of one of the busbars 21 and 22 entered in the body part 50 and the connecting piece 45 of one busbar 38 toward an inner surface of the body part 50, so that the electric contacting sections 48 connects the connecting piece 52 of one of the busbars 21 and 22 to the connecting piece 45 of the one busbar 38. The connecting piece 49 is formed in a flat plate-shape and connects the pair of the electric contacting sections 48 to each other.

When the cassette block 5 and the integration 7 are mounted to the body part 4 of the box body 2, the terminal fitting 47 connects the connecting piece 52 of one of the busbars 21 and 22 of the wiring block 3 to the connecting piece 45 of one busbar 38 of the integration 7, so that the connector section 20 supplies the electric power from the power supply to the integration 7.

The cassette block 5 and the integration 7 are mounted to the body part 4, various electrical components and fuses 40 are attached to the mounting sections and the fuse attaching sections 41, and the connectors of the wiring harness fit to the fitting sections and the connector fitting sections 41, so that the electric junction box 1 electrically connects the power supply, electrical components, fuses 40, relays 39, and various electronic instruments connected by means of the wiring harness to one another according to a predetermined pattern. Then, the electric junction box 1 supplies the electric power from the power supply to the various electronic instruments through the electrical components, fuses 40 and the relays 39.

According to the preferred embodiments described above, since the box body 2 includes the connector section 20 which connects busbars 21, 22, to which the electric power from the power supply is supplied, to the connecting piece 45 as the electric power inputting section of the integration 7, therefore there is no necessity to connect one of the busbars 21 and 22 to the integration 7 through electric wires. As a result, such electric wires for connecting one of the busbars 21 and 22 to the integration 7 is not needed and therefore, a connecting structure and man-hour associated with the connection using such electric wires are not needed. Accordingly, there is no necessity to bend an electric wire within a narrow space, so that the electric junction box 1 can be easily assembled. That is, the electric junction box 1 can be easily assembled even if the electric junction box 1 includes the integration 7 as the electric power distributing unit.

Moreover, since the connector section 20 includes: the terminal fitting 47 connected to both of one of the busbars 21 and 22 and the connecting piece 45 as the electric power inputting section of the integration 7; and the housing 46 which receives the terminal fitting 47, therefore the connector section 20 can securely directly connect one of the busbars 21 and 22 to the integration 7. Accordingly, there is no necessity to bend an electric wire within a narrow space, so that the electric junction box 1 can be easily assembled. That is, the electric junction box 1 can be easily assembled even if the electric junction box 1 includes the integration 7 as the electric power distributing unit.

The aforementioned preferred embodiments are described to aid in understanding the present invention and variations may be made by one skilled in the art without departing from the spirit and scope of the present invention.

What is claimed is:

1. An electric junction box comprising:

a box body;

a busbar attached to the box body, electric power from a power supply being supplied to the busbar;

an electric power distributing unit attached to the box body, the electric power being supplied to the electric power distributing unit through the busbar; and a connector section including an electrically insulating housing and a terminal fitting for connecting the busbar to an electric power inputting section of the electric power distributing unit, the box body being provided with the connector section.

2. The electric junction box according to claim 1, wherein said terminal fitting is connected to both of the busbar and the electric power inputting section of the electric power distributing unit; and said electrically insulating housing receiving the terminal fitting.

* * * * *